United States Patent
Kim et al.

(10) Patent No.: US 9,591,765 B2
(45) Date of Patent: Mar. 7, 2017

(54) FLEXIBLE DISPLAY PANEL AND FABRICATING METHOD THEREOF, AND IMAGE DISPLAY TERMINAL UNIT

(71) Applicant: LG Display Co., Ltd., Seoul (KR)

(72) Inventors: JungChul Kim, Gyeonggi-do (KR); SoonKwang Hong, Daegu (KR); SeokHee Jeong, Daegu (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 14/061,921

(22) Filed: Oct. 24, 2013

(65) Prior Publication Data

US 2014/0118970 A1   May 1, 2014

(30) Foreign Application Priority Data

Oct. 31, 2012 (KR) .................. 10-2012-0122563

(51) Int. Cl.
*G02F 1/1345* (2006.01)
*H05K 3/00* (2006.01)
*G06F 1/16* (2006.01)
*H04M 1/02* (2006.01)

(52) U.S. Cl.
CPC ............. *H05K 3/00* (2013.01); *G06F 1/1652* (2013.01); *H04M 1/0268* (2013.01); *Y10T 29/49002* (2015.01); *Y10T 29/49117* (2015.01)

(58) Field of Classification Search
CPC ......... Y10T 29/49117; Y10T 29/49002; G06F 1/1652; H04M 1/0268; H05K 3/00
USPC .................................................. 349/149–152
See application file for complete search history.

(56) References Cited

U.S. PATENT DOCUMENTS

| | | | |
|---|---|---|---|
| 6,836,669 B2 * | 12/2004 | Miyake et al. ............ | 455/556.1 |
| 7,492,361 B2 | 2/2009 | Kawachi et al. | |
| 7,495,702 B2 * | 2/2009 | Herranen et al. ............ | 348/373 |
| 8,885,096 B2 * | 11/2014 | Vakil ............................ | 348/374 |
| 2002/0065102 A1 | 5/2002 | Miyake et al. | |

(Continued)

FOREIGN PATENT DOCUMENTS

| | | |
|---|---|---|
| JP | 2005-301219 A | 10/2005 |
| JP | 2008-053727 A | 3/2008 |

(Continued)

OTHER PUBLICATIONS

German Office Action dated Jun. 2, 2014 for German Patent Application No. 10 2013 111 865.8.

(Continued)

*Primary Examiner* — Charles Chang
(74) *Attorney, Agent, or Firm* — Morgan, Lewis & Bockius LLP

(57) ABSTRACT

A flexible display panel, and particularly, to a flexible display panel which is bendable, not an existing glass substrate, a fabrication method thereof, and an image display terminal unit using a flexible display panel are provided.
In the case of the flexible display panel, the fabrication method, and the image display terminal unit, the flexible display panel is implemented with a plastic substrate, rather than the conventional glass substrate, and a portion of the non-active area of the display panel is cut to form a cutout portion to insert modules of the image display terminal unit into the cutout portion to thus reduce a receiving space of the lower housing, thereby minimizing a width of the bezel region.

19 Claims, 9 Drawing Sheets

(56) References Cited

U.S. PATENT DOCUMENTS

| | | |
|---|---|---|
| 2002/0125815 A1 | 9/2002 | Wakita |
| 2004/0106440 A1 | 6/2004 | Haruyama |
| 2008/0050852 A1 | 2/2008 | Hwang et al. |
| 2008/0088765 A1* | 4/2008 | Hashimoto ........... G02F 1/1333 349/58 |
| 2008/0117367 A1* | 5/2008 | Abe .................... G02F 1/13452 349/106 |
| 2008/0225221 A1 | 9/2008 | Abe |
| 2009/0115754 A1 | 5/2009 | Kawachi et al. |
| 2010/0073620 A1 | 3/2010 | Yamaguchi et al. |
| 2012/0033156 A1* | 2/2012 | Yamazaki ......... G02F 1/133555 349/62 |
| 2012/0069241 A1* | 3/2012 | Shiau .................... G06F 1/1686 348/373 |
| 2013/0016267 A1* | 1/2013 | Ko ........................ G06F 1/1637 348/333.01 |
| 2013/0175154 A1 | 7/2013 | Takahashi |
| 2013/0328051 A1* | 12/2013 | Franklin ............... H01L 29/786 257/59 |

FOREIGN PATENT DOCUMENTS

| | | |
|---|---|---|
| TW | 546946 B | 8/2003 |
| TW | 201214361 A | 4/2012 |
| TW | 201229624 A | 7/2012 |

OTHER PUBLICATIONS

Chinese Office Action dated Jul. 1, 2015, in Chinese Patent Application No. 201310529399.8.
Taiwanese Office Action dated Oct. 13, 2015, in Taiwanese Patent Application No. 102139342.

* cited by examiner

FLEXIBLE DISPLAY PANEL AND FABRICATING METHOD THEREOF, AND IMAGE DISPLAY TERMINAL UNIT

CROSS-REFERENCE TO RELATED APPLICATION

Pursuant to 35 U.S.C. §119(a), this application claims the benefit of earlier filing date and right of priority to Korean Application No. 10-2012-0122563, filed on Oct. 31, 2012, the contents of which is incorporated by reference herein in its entirety.

BACKGROUND OF THE INVENTION

1. Field of the Invention

The present disclosure relates to a flexible display panel, and particularly, to a flexible display panel which is bendable, rather than an existing glass substrate, a fabrication method thereof, and an image display terminal unit using a flexible display panel.

2. Background of the Invention

Flat panel displays replacing existing cathode ray tube (CRT) display devices include a liquid crystal display (LCD), a field emission display (FED), a plasma display panel (PDP), an organic light emitting diode (OLED) display device, and the like.

A flat panel display device includes a plurality of switching elements formed on a glass substrate, gray levels of an image are represented by pixels according to signals applied thereto to implement an image. In particular, among flat panel display devices, LED or OLED display devices, which is lighter, thinner, shorter, and smaller, are commonly used in portable devices such as small cellular phones, as well as in large TVs.

FIG. 1A is a view illustrating an image display terminal unit using an existing flat panel display device, and FIG. 1B is a view illustrating a configuration in which a flat panel display device is received within a housing of the image display terminal unit of FIG. 1A.

Referring to FIGS. 1A and 1B, the related art image display terminal unit 1 has the exterior formed as a front housing 2 and a rear housing 3 are coupled. A display panel 5, an interface module 11, a camera module 14, and the like, are accommodated within the rear housing 3.

When the image display terminal unit 1 is viewed from the front side, the display panel 5 is disposed such that an active area A/A is exposed to a central opening of the front housing 2, and a non-active area N/A is covered by the front housing 2 and coupled to and supported by the rear housing 3.

Also, a camera sensor module 14 and a sensor module 15 performing a camera function and a sensor function, respectively, are disposed in parallel to a certain module 18 in an upper portion of the display panel 5, and the interface module 11 receiving user's manipulation is disposed in a lower portion of the display panel 5.

In this structure, in an upper portion of the display panel 5, a substrate 17 of the camera module 14 and the sensor module 15 and a substrate 19 of the certain module 18 are disposed to be adjacent in parallel, determining a width (a) of an upper bezel region of the image display terminal unit 1, and in a lower portion of the display panel 5, a substrate 12 of the interface 11 is disposed, determining a lower bezel region, and an overall width of the image display terminal unit 1 includes the upper bezel region and the lower bezel region.

Meanwhile, recently, a width of the bezel region, excluding a region in which an image is displayed, of the image display terminal unit 1 tends to be minimized, and thus, the image display terminal unit is designed such that margins between the display panel 5 and the respective modules are minimized.

However, in a case in which the display panel 5 and the substrates 12, 17, and 19 of the respective modules are disposed in an overlapping manner to minimize a width of the bezel region, a short-circuit may be occurred between the substrates and the overall thickness of the image display terminal unit 10 may be increased.

Also, since a driving unit 51 and a substrate connection pad 52 are required to be installed in the non-active area N/A of the display panel 5, there is a limitation in reducing the width of the non-active area N/A, making it difficult to minimize the width of the bezel region of the image display terminal unit using the related art display panel.

SUMMARY OF THE INVENTION

Therefore, an aspect of the detailed description is to provide a flexible display panel having a bezel region whose width is minimized in an image display terminal unit using a flat panel display device, a fabrication method thereof, and an image display terminal unit using the flexible display panel.

To achieve these and other advantages and in accordance with the purpose of this specification, as embodied and broadly described herein, a flexible display panel includes: a plastic substrate; an active area in which a plurality of pixels are formed on the plastic substrate; and a non-active area surrounding the active area, including at least one driving unit mounted thereon, and having at least one cutout portion.

The at least one cutout portion may have a triangular shape, a quadrangular shape, a polygonal shape, a circular shape, or an oval shape.

At least one side of the non-active area has a convex shape.

A printed circuit board (PCB) electrically connected to the driving unit may be bonded to the one side.

To achieve these and other advantages and in accordance with the purpose of this specification, as embodied and broadly described herein, an image display terminal unit including: a flexible display panel including an active area in which a plurality of pixels are formed on a plastic substrate, and a non-active area surrounding the active area, including at least one driving unit mounted thereon, and having at least one cutout portion; a system module processing input and output functions of the terminal unit; and a housing accommodating the flexible display panel and the system module.

The system module may be disposed in an inner side of the cutout portion so as to be accommodated together with the display panel in parallel in the housing.

The system module may include at least one of an image capture module, a sensor module, a sound module, a microphone module, and an interface module.

The at least one cutout portion may have a triangular shape, a quadrangular shape, a polygonal shape, a circular shape, or an oval shape.

At least one side of the non-active area has a convex shape.

A printed circuit board (PCB) electrically connected to the driving unit may be bonded to the one side.

To achieve these and other advantages and in accordance with the purpose of this specification, as embodied and broadly described herein, a method for fabricating a flexible display panel, includes preparing a plastic substrate; defining an active area in which a plurality of pixels are formed and a non-active area surrounding the active area on the plastic substrate; and forming at least one cutout portion in the non-active area.

The defining of the non-active area may include mounting a driving unit in one portion of the non-active area.

The method may further include: bonding a printed circuit board (PCB) electrically connected to the driving unit, after the defining of the non-active area.

The forming of at least one cutout portion in the non-active area may include: forming a cutting region on the plastic substrate; and removing the cutting region through a ultrasonic cutting process, a wheel cutting process, or a puching process.

In the case of the flexible display panel, the fabrication method, and the image display terminal unit according to embodiments of the present invention, the flexible display panel is implemented with a plastic substrate, rather than the conventional glass substrate, and a portion of the non-active-area of the display panel is cut to form a cutout portion to insert modules of the image display terminal unit into the cutout portion to thus reduce a receiving space of the lower housing, thereby minimizing a width of the bezel region.

Further scope of applicability of the present application will become more apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from the detailed description.

BRIEF DESCRIPTION OF THE DRAWINGS

The accompanying drawings, which are included to provide a further understanding of the invention and are incorporated in and constitute a part of this specification, illustrate exemplary embodiments and together with the description serve to explain the principles of the invention.

In the drawings.

DETAILED DESCRIPTION OF THE INVENTION

Hereinafter, a flexible display panel, a fabrication method thereof, and an image display terminal unit according to embodiments of the present invention will be described with reference to the accompanying drawings.

In particular, the present invention employs a plastic substrate as a display panel, in place of a glass substrate used as a display panel substrate in the conventional flat panel display devices Among existing flag panel display devices, a liquid crystal display (LCD) device uses a glass substrate to endure a high level of heat generated during a fabrication process, having a limitation in providing a light-weight, thinner configuration and flexibility. However, unlike an LED device, in case of an organic light emitting display device, a substrate may be fabricated with a flexible material such as plastic, or the like, instead of a glass substrate. Thus, in an embodiment of the present invention, a flexible display panel including organic light emitting diodes (or organic electroluminescent diodes) is used.

Figure 2A:
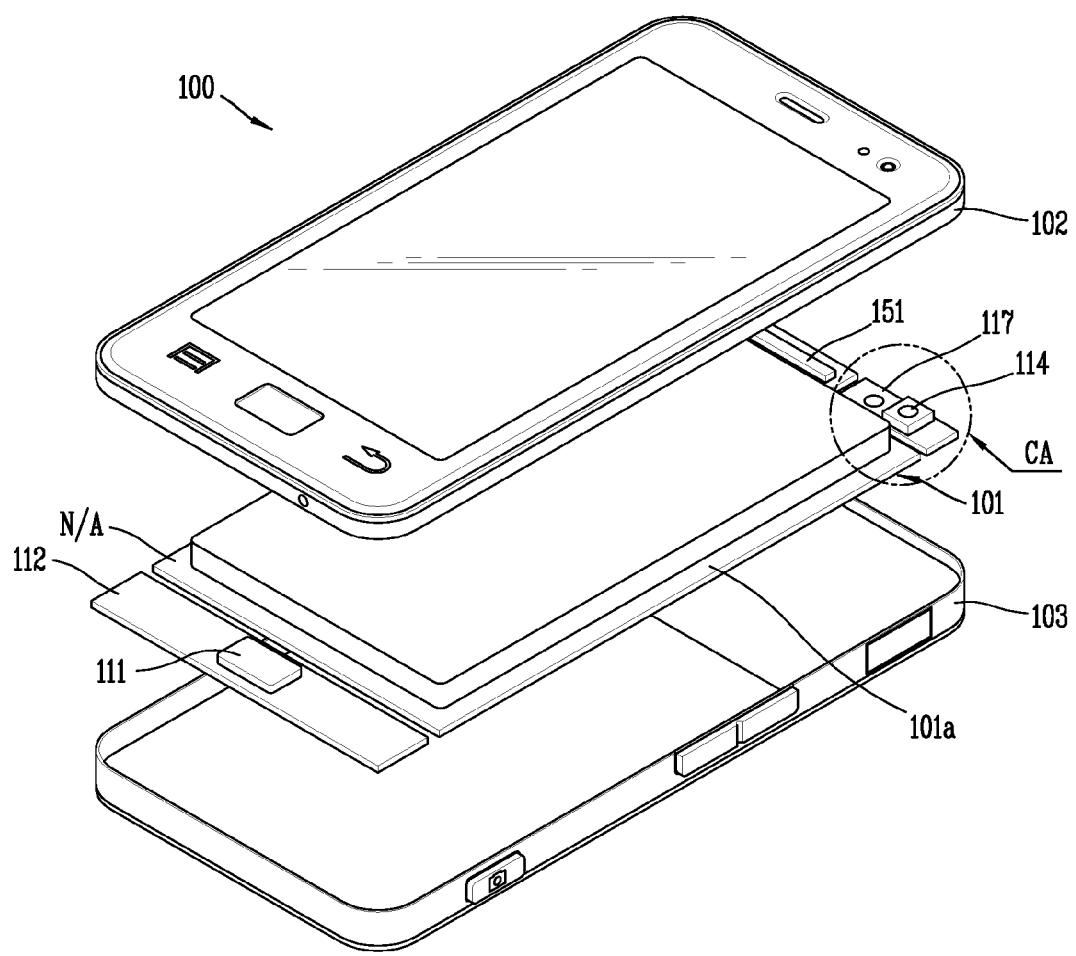
FIG. 2A is an exploded perspective view of an image display terminal unit using a flexible display panel according to an embodiment of the present invention.
Figure 2B:
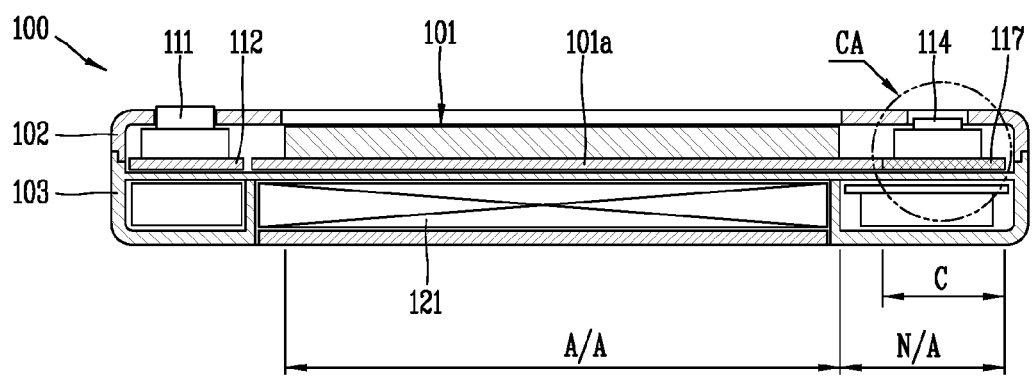
FIG. 2B is a cross-sectional view of an assembled image display terminal unit.

FIG. 2A is an exploded perspective view of an image display terminal unit using a flexible display panel according to an embodiment of the present invention, and FIG. 2B is a cross-sectional view of an assembled image display terminal unit.

As illustrated, an image display terminal unit 100 includes a flexible display panel 101 including an active area A/A in which a plurality of pixels defined on a plastic substrate 101a are formed and a non-active area N/A surrounding the active area A/A, including at least one driving unit mounted thereon, and having at least one cutout portion CA, input and output modules 111 and 114 processing input and output functions of the terminal unit, and housings 102 and 103 accommodating the flexible display panel and a system module.

The display panel 101 includes the active area A/A displaying an image and the non-active area N/A surrounding the active area A/A and having a driving circuit therein. Various signal lines and thin film transistors (TFTs) for implementing pixels are formed on the active area A/A, and a thin film encapsulation layer is formed thereon. A polarizer for preventing reflection of light made incident from the outside may be attached to a surface of the encapsulation layer.

The plastic substrate 101a may be made of a polyimide (PI) material, and a back plate (not shown) may be attached to a rear surface of the plastic substrate 101a.

Although not shown, pixels are disposed in a matrix form in the active area A/A of the plastic substrate 101a. A gate driving unit and a data driving unit 151 are disposed in the non-active area N/A in an outer side of the active area A/A in order to drive the pixels and A pad unit may be disposed to be connected to an external system in the non-active area. Here, the gate driving unit may be implemented by a TFT formed in the same process as that of the pixels of the active area A/A.

Also, although not shown, each of the pixels on the plastic substrate 101a includes an OLED and a plurality of driving elements for driving the OLED. The OLED includes a first electrode (a hole injection electrode), an organic compound layer, and a second electrode (an electron injection electrode).

In addition to a light emitting layer from which light is emitted actually, the organic compound layer may include various organic layers for effectively transferring hole or electron carriers to the light emitting layer. The organic layers may include a hole injection layer and a hole transport layer positioned between the first electrode and the light emitting layer, and an electron injection layer and an electron transport layer positioned between the second electrode and the light emitting layer.

A driving element may include at least two TFTs and at least one storage capacitor. The TFTs include at least a switching transistor and a driving transistor.

The switching transistor is connected to a gate line and a data line, and applies a data voltage input to the data line to a gate electrode of the driving transistor according to a scan signal input to the gate line. The capacitor is connected to the switching transistor and a power supply line and stores a voltage corresponding to a difference between a voltage received from the switching transistor and a voltage supplied to the power supply line.

The driving transistor is connected to a power source line and the capacitor to supply an output current in proportion to the square of a difference between a voltage stored in the capacitor and a threshold voltage to the OLED, and the OLED emits light by the output current. The driving transistor includes a gate electrode, a source electrode, and a drain electrode. A cathode electrode of the OLED may be connected to the drain electrode of the driving transistor. However, the configuration of the pixel is not limited to the foregoing example and may be variously modified.

In particular, the cutout portion CA cut out to have a predetermined width is formed in one corner portion of the plastic substrate 101a. The cutout portion CA may be formed to be as close as possible to the active area A/A and may be formed through an ultrasonic cutting machine, a wheel cutting machine, or a punching machine. Accordingly, the upper portion of the plastic substrate 101 has a convex shape. Namely, in the case of a glass substrate used as a substrate of the conventional display panel 101, a process of cutting only a portion of the substrate is not easy. In comparison, however, in an embodiment of the present invention, the plastic substrate 101a is used instead of a glass substrate and an unnecessary portion of the non-active area N/A is removed and modules of the image display terminal unit 100 are disposed in the corresponding space, thus reducing an overall size.

Thus, at least one of the system modules 111 and 114 processing input and output functions of the terminal unit is disposed in the interior of the cutout portion CA of the display panel 101. In the drawing, an example in which the camera module 114 capturing an image of a front side of the image display terminal unit 100 and the substrate 117 having the camera module 114 thereon are disposed is illustrated. Also, the system module 111 and the substrate 112 having the system module 111 mounted thereon are disposed in a lower portion of the display panel 101.

The system modules 111 and 114 may include at least one of an image capture module, a sensor module, a sound module, a microphone module, and an interface module.

Through such dispositions, the display panel 101 and various modules 111 and 114 are received in the lower housing 103, and the upper housing 102 is coupled to the housing 103 to complete the image display terminal unit 100.

The upper housing 102 has a central opening exposing the active area A/A of the display panel 101, and holes are formed thereon to expose the system modules 111 and 114. Side walls having a predetermined height are formed on the edges of the upper housing 102 to border the display panel 101 and the system modules 111 and 114 and coupled to the lower housing 103.

The lower housing 103 may be coupled to the upper housing 103 in a corresponding manner, and have a space for receiving the display panel 101 and the input and output modules 111 and 114. Here, a battery 121, or the like, of the image display terminal unit 100 may be further disposed on a rear surface of the display panel 101.

In particular, as for the lower housing 103, since the camera module 114 is insertedly positioned in the cutout portion CA of the display panel 101, the bezel region of the image display terminal unit 100 can be minimized by the width C of the cutout portion CA.

Hereinafter, various structures of the flexible display panel according to an embodiment of the present invention will be described with reference to the accompanying drawings.

Figure 3A:
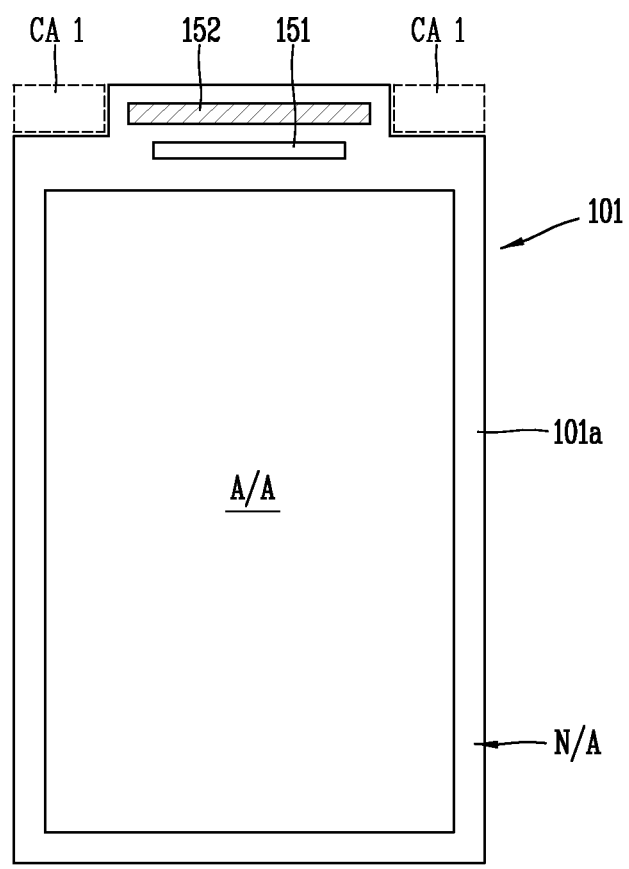
FIG. 3A through 3C are views illustrating structures of various cutout portions of the flexible display panel according to an embodiment of the present invention.
Figure 3B:
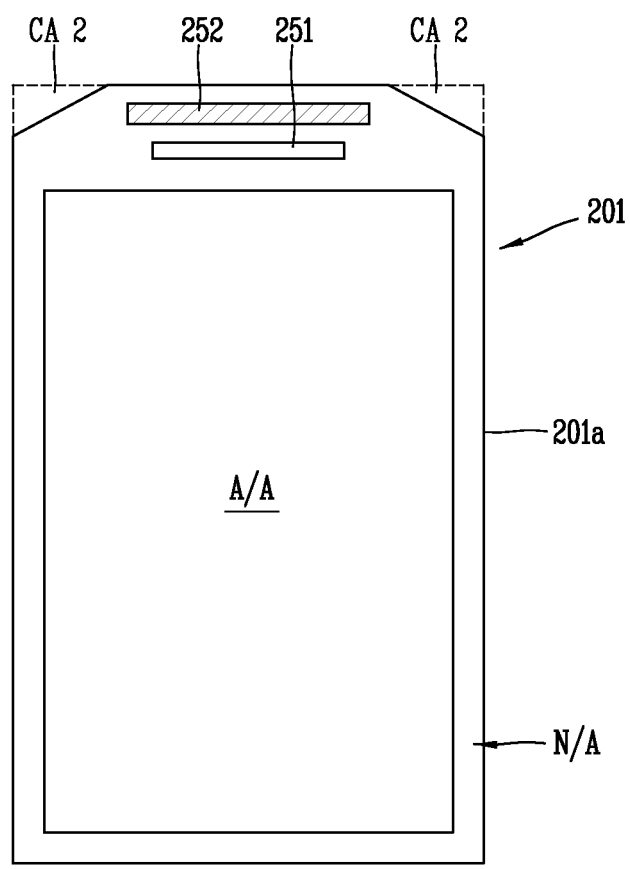
Figure 3C:
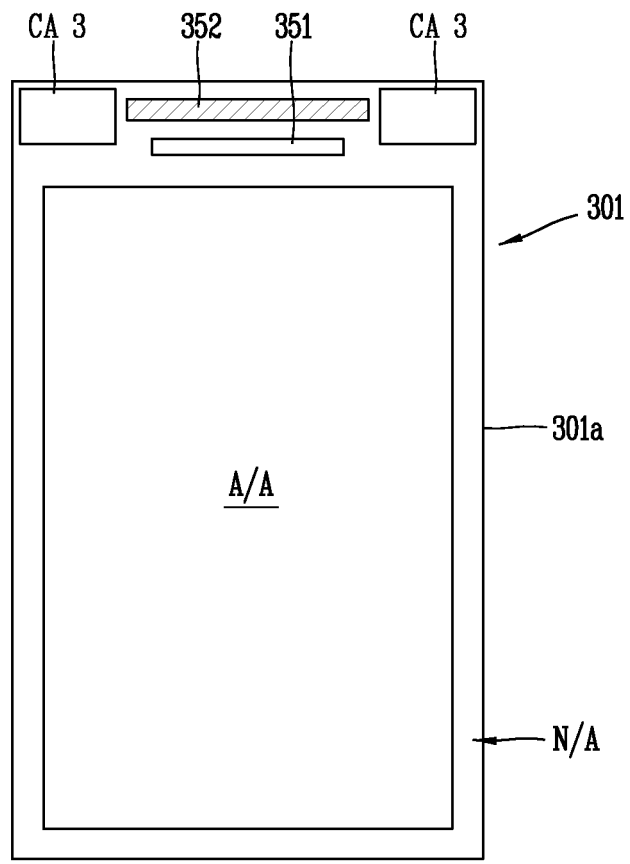

FIGS. 3A through 3C are views illustrating structures of various cutout portions of the flexible display panel according to an embodiment of the present invention.

Referring to the drawings, the display panel according to an embodiment of the present invention includes the active area A/A in which a plurality of pixels are formed on the plastic substrate 101a having a rectangular shape and the non-active area N/A surrounding the active area A/A and having a driving unit for driving the pixels, mounted thereon.

In particular, one or more driving units 151 and a pad unit 152 to which a printed circuit board (PCB) as a means for electrically connecting the driving unit 151 and an external system (not shown) is bonded, are formed in the upper non-active area N/A of the display panel. One or more cutout portions CA1 are formed to be adjacent to the active area A/A by a minimum margin therebetween, in other portions excluding the driving unit 151 and the pad unit 152.

Here, one or more cutout portions CA1 may be formed in consideration of modules provided in the image display terminal unit, and may be formed as large as possible within a range in which they do not affect a signal line, or the like, formed in the non-active area N/A and electrically connecting the pixels and the driving unit. As illustrated in FIG. 3A, by the presence of the cutout portions CA1, the upper portion of the display panel 101 has a convex shape.

Also, in a case in which it is not easy to cut the plastic substrate 101a to have two sides according to characteristics of a cutting machine, or the like, to form the cutout portion CA1, as illustrated in FIG. 3B, a plastic substrate 101a may be cut to form cutout portions CA2 having a triangular shape. Accordingly, the display panel 201 has such a shape that a width thereof is gradually narrowed upwardly on the non-active area N/A. This structure is advantageous for securing a space for forming signal lines (not shown) electrically connecting the driving unit 251 and the pad unit 252 to the system modules.

Also, referring to FIG. 3C, cutout portions CA3 may be formed such that ends thereof form a closed loop in both sides of the driving unit 351 and the pad unit 352 provided in the upper non-active area N/A of a display panel 301.

The outer edges of the display panel 301 having the structure illustrated in FIG. 3C has a rectangular shape, the same as that of the related art, facilitating processing, and since system modules can be inserted into the cutout portions CA3, the technical characteristics of the present invention can be advantageously applied in the same manner.

Figure 4:
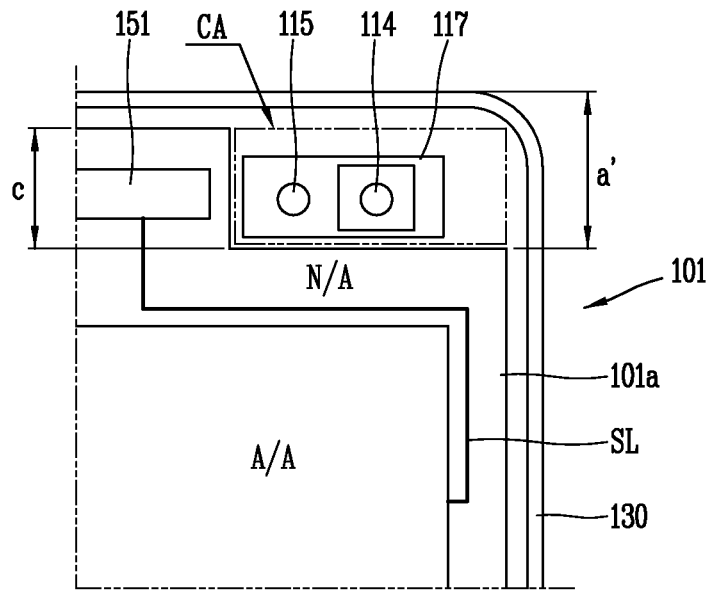
FIG. 4 is a view illustrating a portion of the interior of the image display terminal unit using the flexible display panel according to an embodiment of the present invention.

FIG. 4 is a view illustrating a portion of the interior of the image display terminal unit using the flexible display panel according to an embodiment of the present invention.

Figure 1A:
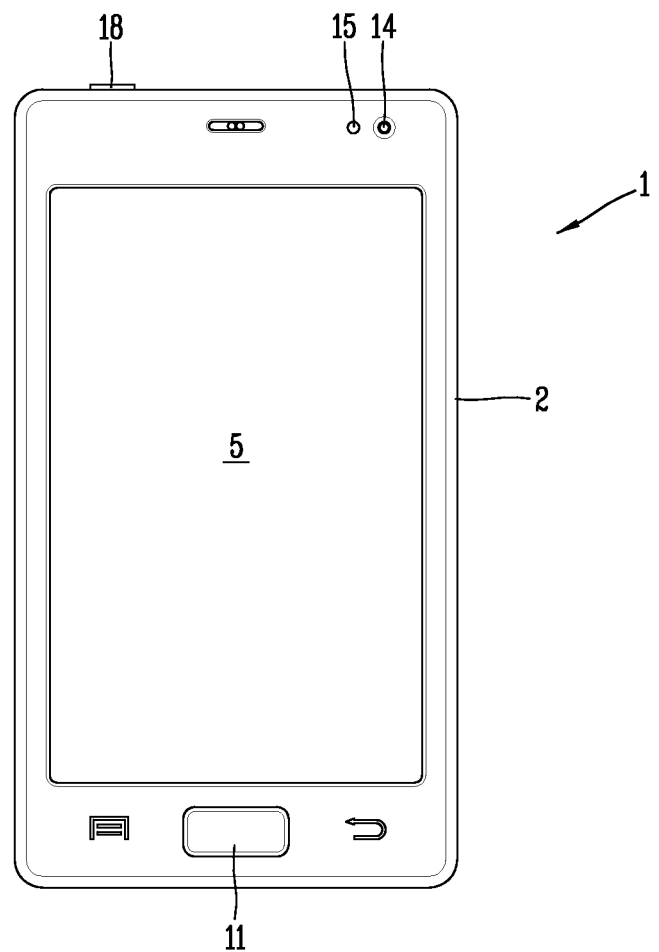
FIG. 1A is a view illustrating an image display terminal unit using an existing flat panel display device.
Figure 1B:
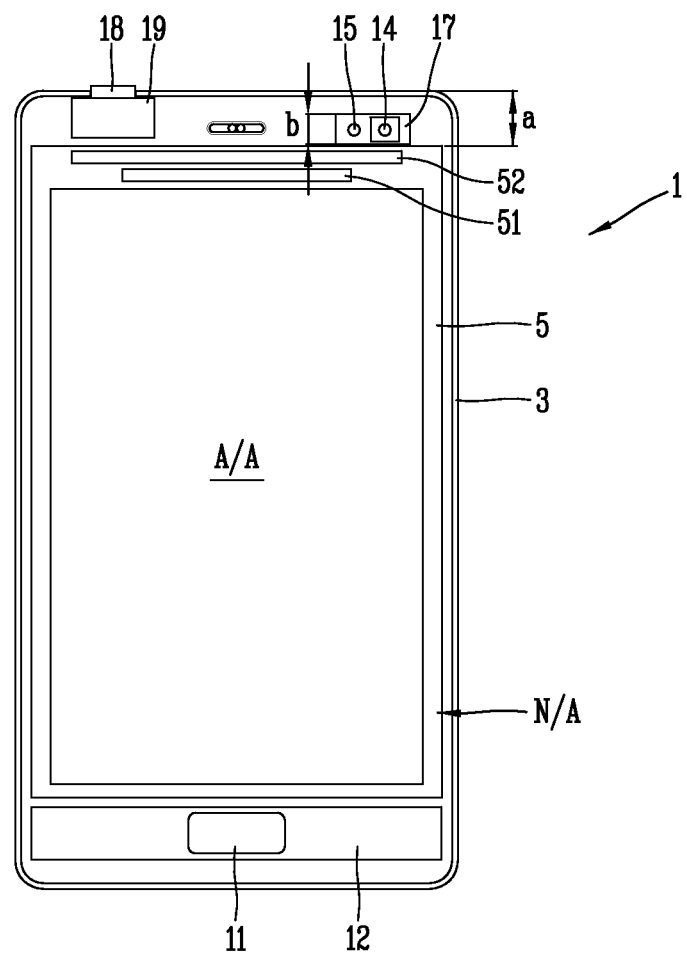
FIG. 1B is a view illustrating a configuration in which a flat panel display device is received within a housing of the image display terminal unit of FIG. 1A.

As illustrated, in the display panel 101 according to an embodiment of the present invention, since a corner portion of the plastic substrate 101a is cut out, the substrate 117 on which the camera module 114 and the sensor module 115 are mounted is disposed therein. Here, the cutout portion CA is formed such that a predetermined width (c) thereof is adjacent to the driving unit 151 as close as possible in an X direction and is adjacent to the active area A/A to the maximum in a Y direction but with a space therebetween allowing the signal line SL to be formed on the non-active area N/A. Thus, the image display terminal unit is designed to have a bezel region minimized in comparison to the related art (a of FIG. 1B>a' of FIG. 4).

Hereinafter, a method for fabricating a flexible display panel according to an embodiment of the present invention will be described with reference to the accompanying drawings.

Figure 5:
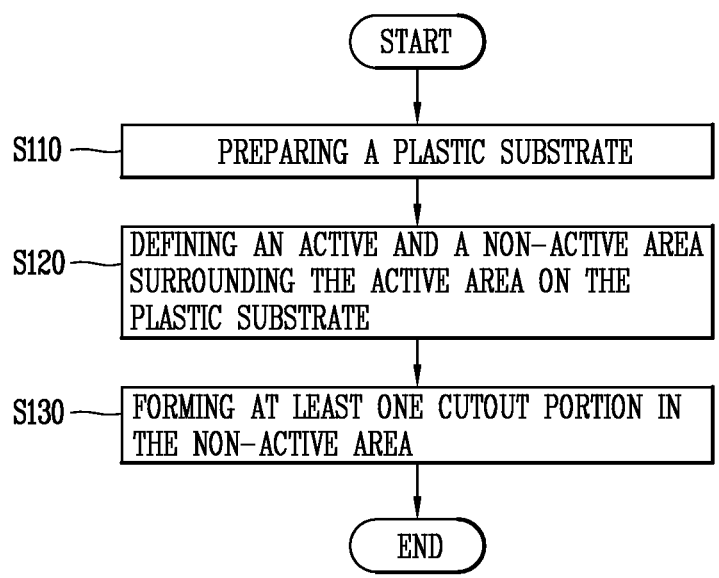
FIG. 5 is a flow chart illustrating a method for fabricating a flexible display panel according to an embodiment of the present invention.

FIG. 5 is a flow chart illustrating a method for fabricating a flexible display panel according to an embodiment of the present invention.

As illustrated, the method for fabricating a flexible display panel according to an embodiment of the present invention includes preparing a plastic substrate (S110), defining an active area in which a plurality of pixels are formed and a non-active area surrounding the active area on the plastic substrate (S120), and forming at least one cutout portion in the non-active area (S130).

In the step (S110) of preparing a plastic substrate, a plastic substrate to be processed is prepared, and an auxiliary glass substrate supporting ductility of the plastic substrate is attached to a rear surface of the substrate. Unlike the conventional glass substrate, the plastic substrate having ductility is easily bendable, making it difficult to perform a process such as photolithography, or the like. Thus, an auxiliary glass substrate is attached to the rear surface of the substrate to support it during a process, and when the process is completed, the auxiliary glass substrate is removed.

In the step (S120) of defining the active area in which a plurality of pixels are formed and the non-active area surrounding the active area on the plastic substrate, TFTs and OLEDs are formed on the prepared plastic substrate to form a plurality of pixels to define the active area, and the non-active area in which a plurality of signal lines electrically connecting the respective pixels and the driving unit is defined. The driving unit and the pad unit to which a PCB is bonded are formed in the non-active area.

In the step (S130) of forming at least one cutout portion in the non-display region, a width of a cutout portion is determined according to a size of a module disposed in an upper portion of the display panel, among system modules provided in the image display terminal unit, and accordingly, the plastic substrate is cut.

Figure 6A:
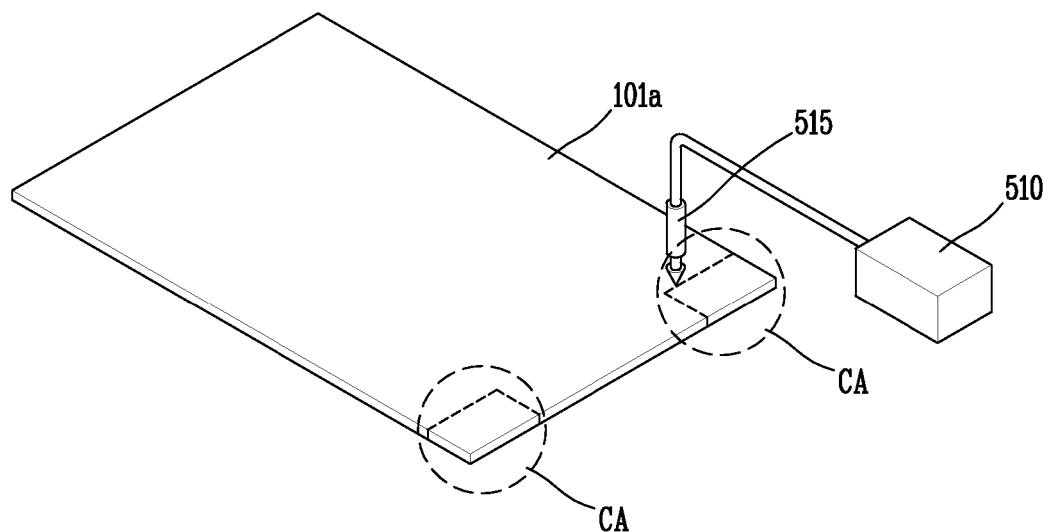
FIGS. 6A through 6C are views illustrating cutting machines used in the process of fabricating the flexible display panel according to an embodiment of the present invention.
Figure 6B:
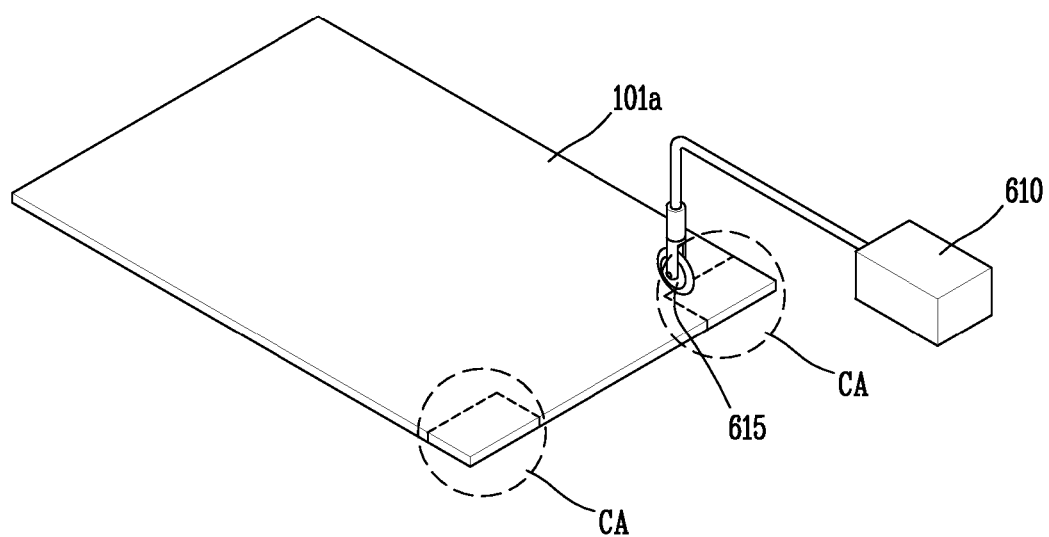
Figure 6C:
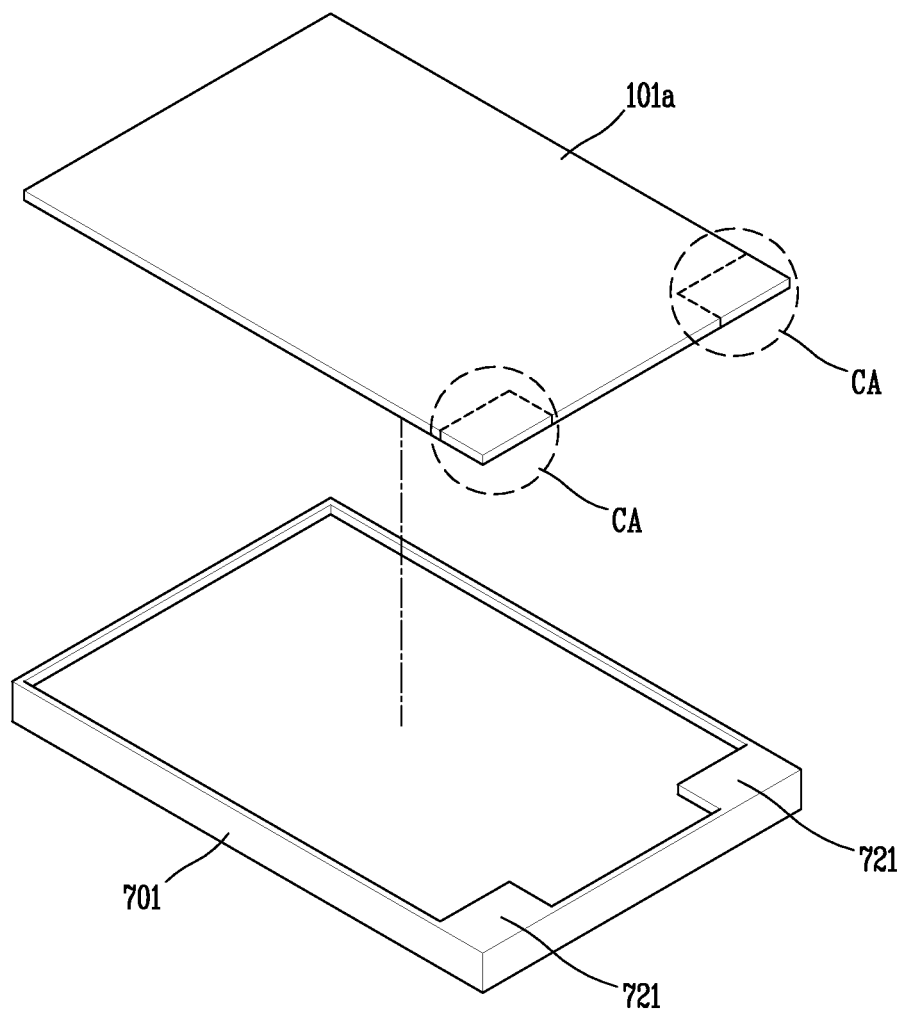

In this case, an ultrasonic cutting machine, a wheel cutting machine, or a punching machine as illustrated in FIGS. 6A through 6C may be used as a cutting machine.

Referring to FIG. 6A, the ultrasonic cutting machine (or an ultrasonic scriber) includes a control device that generates ultrasonic electronic vibrations by using a converter upon receiving power from a power supply device, converts the electrical vibrations into mechanical vibrations through a booster, and transferring the mechanical vibrations to a knife 515. Since cutout portions set on the plastic substrate 101 are cut by using the knife 515, during the cutting operation, a degree of chipping is 300 µm, no burr is generated in edge portions, and a degree of overcut generated in the right angle portion is 350 µm.

Referring to FIG. 6B, in a wheel cutting machine, cutout portions of the plastic substrate 101 are cut by using a wheel cutter 615 through rotary power transferred from a control device 610 including a motor. During a cutting operation, a degree of chipping is 140 µm, burr is generated, and overcut of 340 µm is generated in the right angle portion of the cutout portion CA.

Referring to FIG. 6C, in a punching machine, the plastic substrate 101 is disposed in a jig 701 fabricated to have a shape desired to be formed, and the cutout portions CA are removed by using equipment such as a press, or the like. Protrusion portions 721 corresponding to the cutout portions CA are formed in the jig 701. When the cutout portions CA are formed through the punching machine, during the cutting operation, a degree of chipping is 50 µm or less and burr and overcut are not generated. Thus, it can be seen that the process using a punching machine is appropriate for processing the flexible display panel according to an embodiment of the present invention.

The foregoing embodiments and advantages are merely exemplary and are not to be considered as limiting the present disclosure. The present teachings can be readily applied to other types of apparatuses. This description is intended to be illustrative, and not to limit the scope of the claims. Many alternatives, modifications, and variations will be apparent to those skilled in the art. The features, structures, methods, and other characteristics of the exemplary embodiments described herein may be combined in various ways to obtain additional and/or alternative exemplary embodiments.

As the present features may be embodied in several forms without departing from the characteristics thereof, it should also be understood that the above-described embodiments are not limited by any of the details of the foregoing description, unless otherwise specified, but rather should be considered broadly within its scope as defined in the appended claims, and therefore all changes and modifications that fall within the metes and bounds of the claims, or equivalents of such metes and bounds are therefore intended to be embraced by the appended claims.

What is claimed is:

1. A flexible display panel, comprising:
    a plastic substrate including a back plate on a rear surface thereof;
    an active area in which a plurality of pixels are disposed on the plastic substrate; and
    a non-active area surrounding the active area, comprising:
        at least one pad unit;
        at least one driving unit mounted on the non-active area between the active area and the pad unit; and
        at least one cutout portion,
    wherein the cutout portion is on at least one of both sides of a driving unit on the plastic substrate, the cutout portion extending along the entirety of at least one side of the pad unit,
    wherein the cutout portion is a hole or a concave shape toward the active area,
    wherein a system module is disposed in an inner side of the cutout portion to be accommodated together with the display panel in parallel in a housing, wherein the system module includes at least one of: an image capture module, a sensor module, a sound module, a microphone module, and an interface module, and wherein the cutout portion has a shape corresponding to the system module.

2. The flexible display panel of claim 1, wherein a printed circuit board (PCB) electrically connected to the driving unit is bonded to the one side.

3. The flexible display panel of claim 1, wherein the cutout portion is surrounded by the plastic substrate.

4. The flexible display panel of claim 1, wherein the cutout portion has a rectangular shape.

5. An image display terminal unit, comprising:
a flexible display panel comprising:
an active area in which a plurality of pixels are disposed on a plastic substrate having a back plate on a rear surface thereof; and
a non-active area surrounding the active area, the non-active area comprising:
at least one pad unit;
at least one driving unit mounted on the non-active area between the active area and the pad unit; and
at least one cutout portion;
a system module processing input and output functions of the terminal unit; and
a housing accommodating the flexible display panel and the system module,
wherein the cutout portion is on at least one of both sides of a driving unit on the plastic substrate, the cutout portion extending along the entirety of at least one side of the pad unit,
wherein the cutout portion is a hole or a concave shape toward the active area,
wherein the system module is inserted into the hole,
wherein the system module is disposed in an inner side of the cutout portion to be accommodated together with the display panel in parallel in the housing,
wherein the system module includes at least one of: an image capture module, a sensor module, a sound module, a microphone module, and an interface module, and
wherein the cutout portion has a shape corresponding to the system module.

6. The image display terminal unit of claim 5, wherein a printed circuit board (PCB) electrically connected to the driving unit is bonded to the one side.

7. A method for fabricating a flexible display panel, the method comprising:
preparing a plastic substrate;
defining an active area in which a plurality of pixels are formed and a non-active area surrounding the active area on the plastic substrate; and
forming at least one cutout portion in the non-active area, the cutout portion extending along the entirety of at least one side of a pad unit on the plastic substrate, the cutout portion being a hole or a concave shape toward the active area,
wherein the forming at least one cutout portion in the non-active area comprises:
forming a cutting region on the plastic substrate; and
removing the cutting region by one of: an ultrasonic cutting process, a wheel cutting process, or a punching process,
wherein a system module is disposed in an inner side of the cutout portion to be accommodated together with the display panel in parallel in a housing,
wherein the system module includes at least one of: an image capture module, a sensor module, a sound module, a microphone module, and an interface module, and
wherein the cutout portion has a shape corresponding to the system module.

8. The method of claim 7, wherein the defining of the non-active area comprises mounting a driving unit in one portion of the non-active area.

9. The method of claim 7, further comprising bonding a printed circuit board (PCB) electrically connected to the driving unit, after the defining of the non-active area.

10. An organic light emitting display device, comprising:
a system module comprising at least one of: an image capture module, a sensor module, a sound module, a microphone module, and an interface module;
a display panel including:
a plastic substrate including an active area comprising a plurality of pixels, at a front surface of the plastic substrate, each of the pixels including an organic light emitting diode and at least one transistor for driving the organic light emitting diode, the plastic substrate including a non-active area surrounding the active area;
a thin film encapsulation layer on the active area;
at least one pad unit on the plastic substrate in the non-active area, the pad unit including one end side and an opposing end side;
a printed circuit board, bonded to one of the at least one pad unit, configured to electrically connect an external system and a driving unit;
a plurality of cutout portions configured at an edge of the plastic substrate such that a shape of at least one cutout portion among the plurality of cutout portions corresponds to the system module, edges along at least one cutout portion including minimal chipping or burring as a result of a cut out process applied to the plastic substrate; and
one or more signal lines on the plastic substrate in the non-active area between the active area and the system module, electrically connecting the plurality of pixels and the driving unit; and
a back plate attached to a rear surface of the plastic substrate.

11. The organic light emitting display device according to claim 10, wherein the plastic substrate comprises a flexible polyimide material.

12. The organic light emitting display device according to claim 11, wherein the at least one cutout portion has a width or cutout depth configured inward toward the active area.

13. The organic light emitting display device according to claim 12, wherein a width or cutout depth of the cutout portion corresponds to a size of the system module.

14. The organic light emitting display device according to claim 13, wherein the at least one cutout portion along an edge of the plastic substrate has a curvature based on at least one among: a circular shape, an oval shape, and a concave shape.

15. The organic light emitting display device according to claim 14, wherein the at least one cutout portion is configured to provide sufficient space for the signal lines in consideration of the system module.

16. The organic light emitting display device according to claim 12, wherein:
the plurality of cutout portions include a first cutout portion adjacent to the one end side of the pad unit; and the width or cutout depth of the first cutout portion is greater than a width of the one end side of the pad unit.

17. The organic light emitting display device according to claim 16, wherein:
the plurality of cutout portions includes a second cutout portion adjacent to the opposing end side of the pad unit; and
the width or cutout depth of the second cutout portion is greater than a width of the opposing end side of the pad unit.

18. The organic light emitting display device according to claim 17, wherein the first and second cutout portions are symmetrical to each other in shape.

19. The organic light emitting display device according to claim 18, wherein the symmetrical shaped first and second cutout portions have one of: a triangular shape, a quadrangular shape, a polygonal shape, a hole shape, a circular shape, and an oval shape.

* * * * *